United States Patent [19]

Sugio

[11] Patent Number: 5,602,796
[45] Date of Patent: Feb. 11, 1997

[54] WORD LINE DRIVER IN A SEMICONDUCTOR MEMORY DEVICE

[75] Inventor: Kenichiro Sugio, Miyazaki, Japan

[73] Assignee: Oki Electric Industry Co., Ltd., Tokyo, Japan

[21] Appl. No.: 318,175

[22] Filed: Oct. 5, 1994

[30] Foreign Application Priority Data

Oct. 13, 1993 [JP] Japan .................................. 5-255424

[51] Int. Cl.$^6$ ..................................................... G11C 8/00
[52] U.S. Cl. ................................ 365/230.06; 365/230.08
[58] Field of Search ......................... 365/230.06, 230.08, 365/189.09, 189.11; 326/80, 86

[56] References Cited

U.S. PATENT DOCUMENTS

| 5,282,171 | 1/1994 | Tokami | 365/230.06 |
| 5,351,217 | 9/1994 | Jean | 365/230.06 |
| 5,394,374 | 2/1995 | Ishimura | 365/230.06 |

FOREIGN PATENT DOCUMENTS

| 0405812 | 1/1991 | European Pat. Off. . |
| 0551598 | 7/1993 | European Pat. Off. . |
| 63-113888 | 5/1988 | Japan . |

OTHER PUBLICATIONS

"Cross-Coupled Level-Shifting Low-Voltage Wordline Driver For Dram," *IBM Technical Disclosure Bulletin*, vol. 34, No. 4B, Sep. 1991, Armonk, NY, pp. 332-334.

*Primary Examiner*—P. Zarabian
*Attorney, Agent, or Firm*—Law Office of Steven M. Rabin, P.C.

[57] ABSTRACT

A word line driver has a decoder for outputting decode signals having first and second logic levels, level shifters for receiving the respective decode signals, each level shifter outputting drive signal having first and third logic levels in response to the received decode signal, the third logic level being higher than the second logic level; a pumping circuit for outputting word line activation signals, at least one of the word line activation signals having the third logic level; and groups of output circuits, each group having the output circuits connected to one of the level shifters and a word line, respectively, each of the output circuits outputting the word line activation signal to the respective word line in response to the decode signal and the drive signal.

13 Claims, 4 Drawing Sheets

WORD LINE DRIVER IN A SEMICONDUCTOR MEMORY DEVICE

CROSS REFERENCE TO RELATED APPLICATION

This application claims rights of priority under 35 USC §119 of Japanese Patent Application Serial No. 255424/1993, filed Oct. 13, 1993, the entire disclosure of which is incorporated herein by reference.

BACKGROUND OF THE INVENTION

This invention relates to a semiconductor integrated circuit device such as a Dynamic Random Access Memory (hereinafter called "DRAM"), a Static Random Access Memory (hereinafter called "SRAM"), a Read Only Memory (hereinafter called "ROM") or the like, and particularly to a word line driver employed in the semiconductor integrated circuit device.

A semiconductor memory device such as a DRAM has a word line driver for selecting one of plural memory cells. This type of word line driver has been disclosed in, for example, Japanese Patent Application Laid-Open Publication No. 63-113888, laid-open to public inspection on May 18, 1988.

SUMMARY OF THE INVENTION

It is an object of the present invention to provide a word line driver capable of reducing the number of elements as compared with a word line driver employed in a conventional semiconductor memory device and providing a reliable operation.

In order to achieve the above object, the present invention provides a word line driver comprising a decoder for outputting decode signals having first and second logic levels, level shifters for receiving the respective decode signals, each level shifter outputting a drive signal having first and third logic levels in response to the received decode signal, the third logic level being higher than the second logic level; a pumping circuit for outputting word line activation signals, at least one of the word line activation signals having the third logic level; and groups of output circuits, each group having the output circuits connected to one of the level shifters and a word line, respectively, each of the output circuits outputting the word line activation signal to the respective word line in response to the decode signal and the drive signal.

BRIEF DESCRIPTION OF THE DRAWINGS

While the specification concludes with claims particularly pointing out and distinctly claiming the subject matter which is regarded as the invention, and it is believed that the invention, the objects, features and advantages thereof, will be better understood from the following description taken in connection with the accompanying drawings in which:

DETAILED DESCRIPTION OF THE PREFERRED EMBODIMENT

Figure 1:
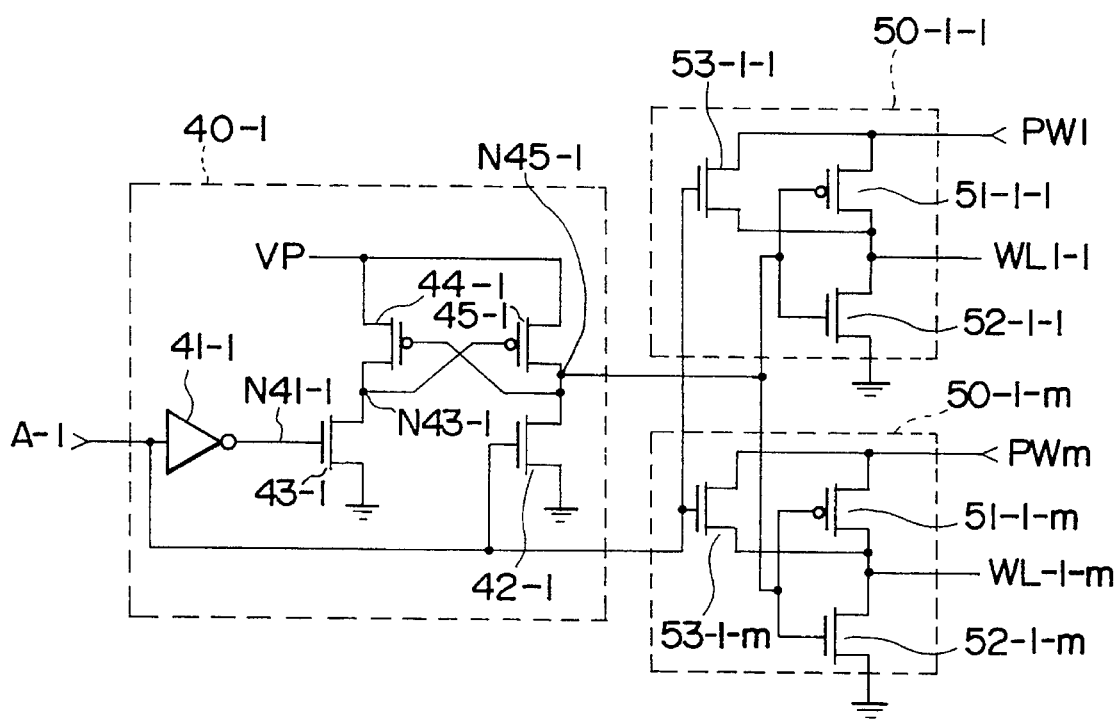
FIG. 1 is a circuit diagram of a part of a word line driver showing an embodiment of the present invention.
Figure 2:
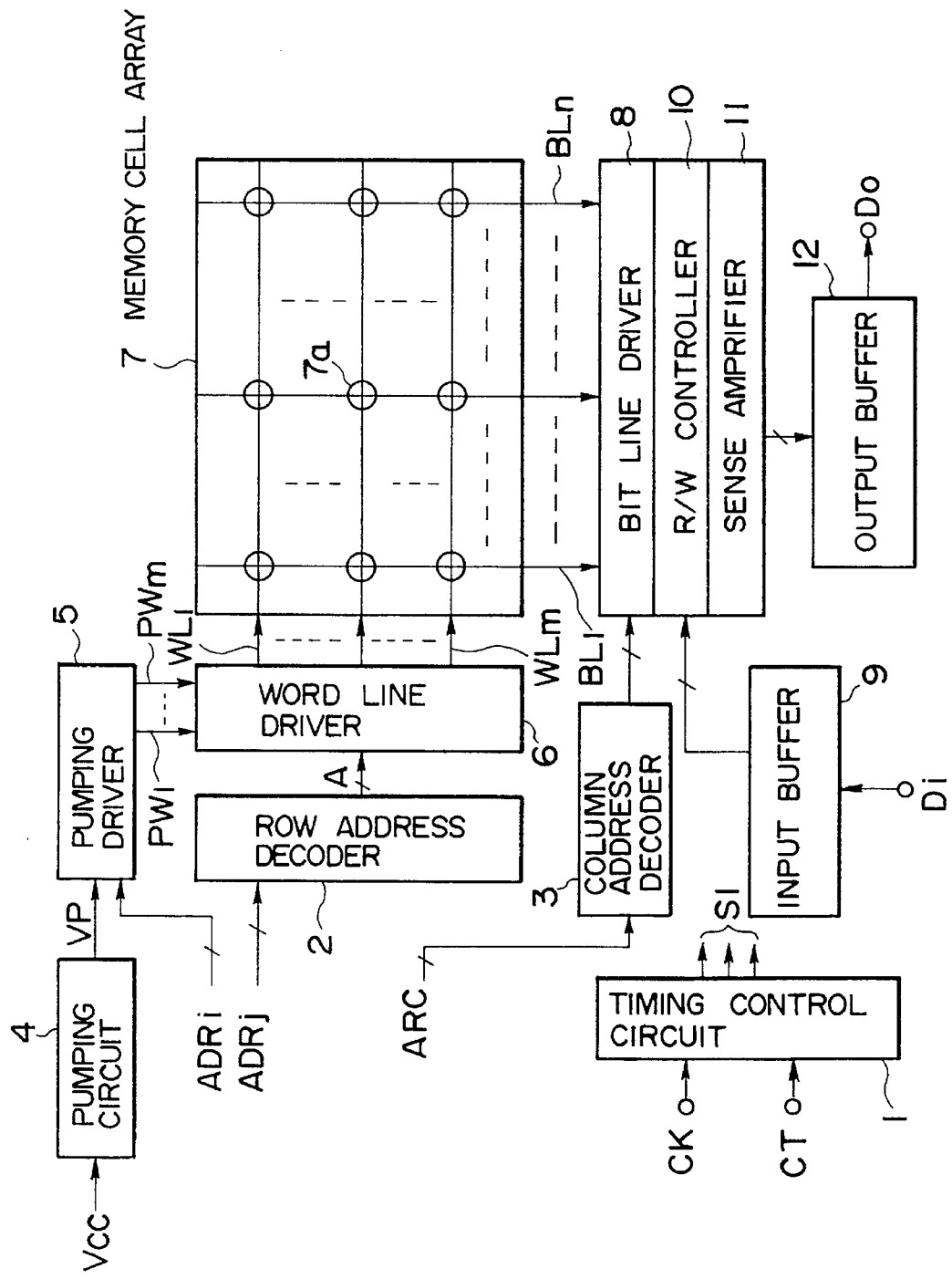
FIG. 2 is a view illustrating a DRAM to which the word line driver shown in FIG. 1, according to the present invention, is applied.

FIG. 1 is a circuit diagram of a part of a word line driver 6 showing one embodiment of the present invention. The word line driver 6 is employed in a DRAM, for example. A block diagram of the DRAM to which the word line driver 6 is applied, is shown in FIG. 2.

The DRAM to which the present invention is applied, will first be described with reference to FIG. 2.

The DRAM comprises a timing control circuit 1 for receiving a control signal CT and a clock CK therein and outputting therefrom control signals $S_1$ for controlling timings provided for respective components, a row address decoder 2 for decoding a row address $ADR_j$ so as to output therefrom a group of decode signals A having a plurality of decode signals A-1 through A-1, a column address decoder 3 for decoding a column address ARC so as to output a decode signal for selecting any of bit lines $BL_1$ through $BL_n$, and a pumping circuit 4 for pumping or boosting a power source voltage VCC (first power source voltage) so as to generate a pumped voltage VP ($=VCC+V_t+\alpha$, where $V_t$: threshold voltage and $\alpha$: positive voltage value).

The word line driver 6 is electrically connected to the pumping circuit 4 through a pumping driver 5. A pumping means comprises the pumping circuit 4 and the pumping driver 5. The pumping driver 5 serves as a circuit for outputting word line activation signals $PW_1$ through $PW_m$ to the word line driver 6 based on a row address $ADR_i$.

The word line driver 6 serves as a circuit for selectively driving word lines $WL_{1-1}$ through $WL_{l-m}$ based on the group of decode signals A and word line activation signals $PW_1$ through $PW_m$. A memory cell array 7 is electrically connected to the word line driver 6. The memory cell array 7 is constructed in such a manner that a plurality of memory cells 7a are respectively electrically connected to points where the plurality of word lines $WL_{1-1}$ through $WL_{l-m}$ and the plurality of bit lines $BL_1$ through $BL_n$ intersect respectively and the memory cells 7a are arranged in matrix form. A bit line driver 8 is electrically connected to the bit lines $BL_1$ through $BL_n$. The bit line driver 8 serves as a circuit for selectively driving the bit lines $BL_1$ through $BL_n$ based on the decode signal output from the column address decoder 3.

Further, an input buffer 9 is provided in the DRAM. The input buffer 9 serves as a circuit for receiving input data $D_i$ therein and outputting the same to a read/write (hereinafter abbreviated as "R/W") controller 10. The R/W controller 10 serves as a circuit for determining, based on the control signal $S_1$, whether data is written into or read from a corresponding memory cell 7a. An output buffer 12 is electrically connected to the R/W controller 10 through a sense amplifier 11. The sense amplifier 11 serves as a circuit for amplifying the output of each memory cell 7a. The output buffer 12 serves as a circuit for receiving the output of the sense amplifier 11 and outputting output data $D_o$ therefrom.

The word line driver 6 provided in the DRAM shown in FIG. 2 will now be described with reference to FIG. 1. The word line driver 6, a part of which is shown in FIG. 1, is comprised of complementary MOS (Complementary Metal Oxide Semiconductor hereinafter called "CMOS") transistors and basically has a plurality of level shifters 40-1 through 40-1 (FIG. 1 shows only one level shifter 40-1) and a plurality of groups of output units 50-1-1 through 50-1-m (FIG. 1 shows only one group of output units 50-1-1 through 50-1-m).

The level shifter 40-1 has an inverter 41-1 for inverting the decode signal A-1 and an N-channel MOS transistor (hereinafter called "NMOS") 42-1 serving as a pull-down switching means whose gate is controlled based on the decode signal A-1. The gate of an NMOS 43-1 is electrically connected to a node N41-1 on the output side of the inverter 41-1 and the source thereof is electrically connected to the ground. Further, the drain of the NMOS transistor 43-1 is electrically connected to a latch circuit for latching a pumped voltage VP therein. The latch circuit comprises P-channel MOS transistors (hereinafter called "PMOS") transistors 44-1 and 45-1. The drain and gate of the PMOS 44-1 and the drain and gate of the PMOS 45-1 are electrically cross-connected between a node N43-1 and the node N45-1. Further, the sources of the PMOSs 44-1 and 45-1 are connected to the boosted voltage VP.

The output unit 50-1-1 comprises a PMOS (first transistor) 51-1-1 and NMOSs (second and third transistors) 52-1-1 and 53-1-1. The source (first electrode), drain (second electrode) and gate of the PMOS 51-1-1 are respectively electrically connected to the word line activation signal $PW_1$, the word line $WL_{1-1}$ and the node N45-1 on the output side of the level shifter 40-1. The NMOS 52-1-1 whose gate is controlled based on a potential at the node N45-1, is electrically connected between the drain of the PMOS 51-1-1 and the ground. The drain of the NMOS 53-1-1 whose gate is controlled based on the decode signal A-1, is electrically connected to the word line activation signal $PW_1$. Further, the source of the NMOS 53-1-1 is electrically connected to the word line $WL_{1-1}$.

Other output units 50-1-2 through 50-1-m respectively connected to the node N45-1 respectively have a circuit configuration identical to that of the output unit 50-1-1. Namely, the output unit 50-1-m comprises a PMOS 51-1-m, an NMOS 52-1-m and an NMOS 53-1-m. The source, drain and gate of the PMOS 51-1-m are respectively electrically connected to the word line activation signal $PW_m$, the word line $WL_{1-m}$ and the node N45-1 on the output side of the level shifter 40-1. The NMOS 52-1-m, whose gate is controlled based on the potential at the node N45-1, is electrically connected between the drain of the PMOS 51-1-m and the ground. The drain of the NMOS 53-1-m, whose gate is controlled based on the decode signal A-1, is electrically connected to the word line activation signal $PW_m$. Further, the source of the NMOS 53-1-m whose gate is controlled based on the first decode signal A-1, is electrically connected to the word line $WL_{1-m}$.

The operation of the word line driver 6 will now be described below.

Figure 3:
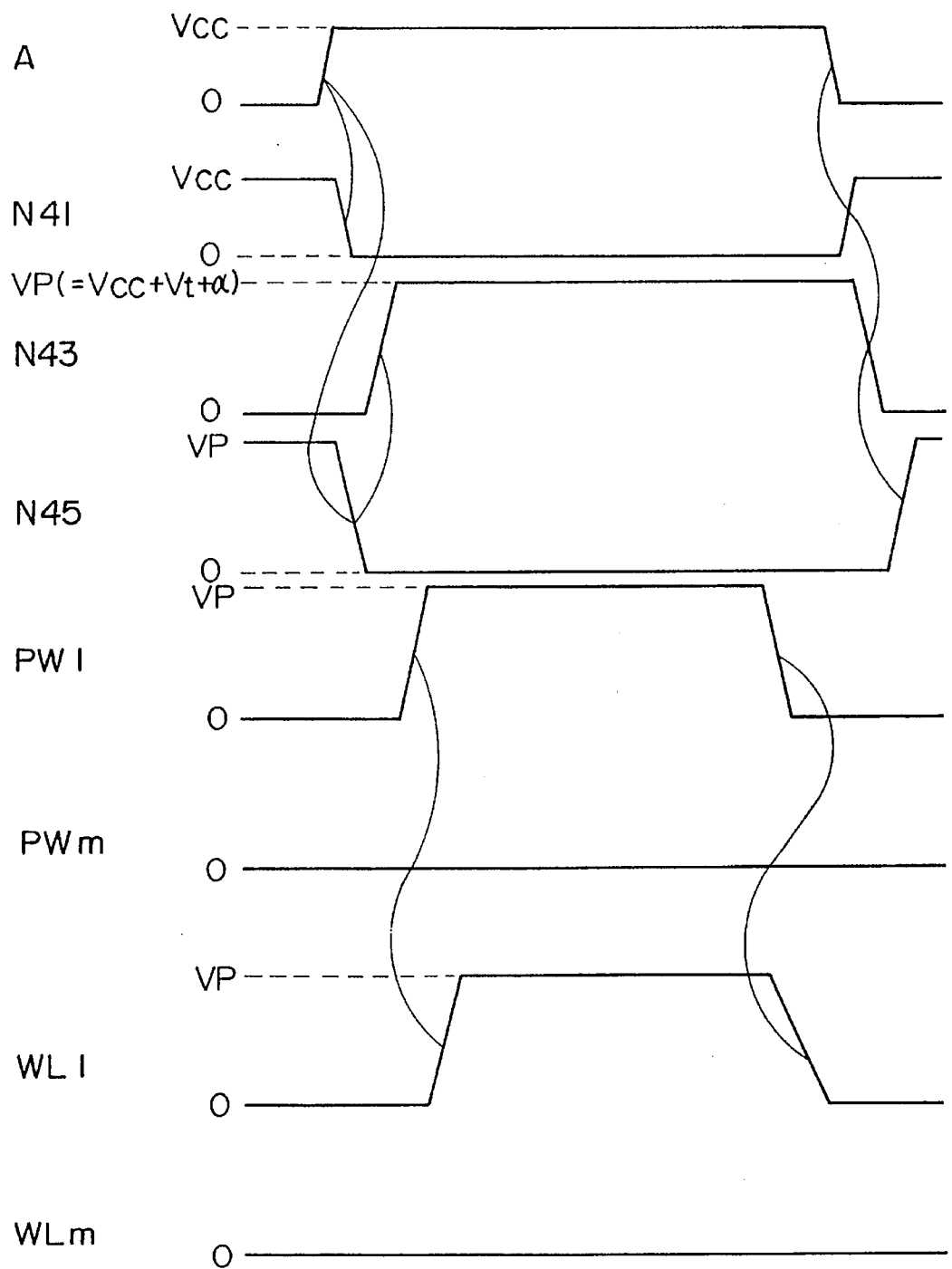
FIG. 3 is a timing chart for describing the operation of the word line driver shown in FIG. 1.

FIG. 3 is a timing chart for describing the operation of the word line driver 6 shown in FIG. 1. In FIG. 3, the abscissa indicates the time and the ordinate indicates the voltage. Write and read operations (1) and (2) shown in FIGS. 1 and 2, which are executed where the output circuit 50-1 is activated and the word line $WL_{1-1}$ is selected, will be described below with reference to FIG. 3 as an illustrative example.

(1) Write operation

When the power source voltage VCC is applied, the timing control circuit 1 outputs the control signals $S_1$ for controlling the timings provided for the respective components, based on the control signal CT and the clock CK. Further, the pumping driver 5 outputs the word line activation signals $PW_1$ through $PW_m$ to the word line driver 6 based on the row address $ADR_i$ (each of the word line activation signals is of a signal having a ground level or a VP level and any of the signals $PW_1$ through $PW_m$ is selectively brought to the VP level). On the other hand, the row address decoder 2 decodes the row address $ADR_j$ so as to output the group of decode signals A therefrom. Further, the column address decoder 3 decodes the column address ARC so as to output the decode signal for selecting any of the bit lines $BL_1$ through $BL_n$. On the other hand, the R/W controller 10 is brought into a data write operating state based on the control signal $S_1$ input from the timing control circuit 1.

(a) Set operation

When the level of the decode signal A-1 which is one of the group of decode signals A changes from the ground level to the VCC, the NMOSs 42-1 and 53-1-1 through 53-1-m are turned on so that the potential at the node N45-1 is brought to the ground level. As a result, the PMOSs 51-1-1 through 51-1-m are brought into an on state. On the other hand, when the level of the word line activation signal $PW_1$ changes from the ground level to the VP level, the VP level is supplied to the word line $WL_{1-1}$ through the NMOS 53-1-1 which has been already turned on but is not fully supplied thereto due to the threshold of the NMOS 53-1-1. However, the word line activation signal having the VP level is sent to the word line $WL_{1-1}$ through the PMOS 51-1-1. Thus, a plurality of memory cells electrically connected to the word line $WL_{1-1}$ are turned on. Further, one of the bit lines $BL_1$ through $BL_n$ is selected by the bit line driver 8 so that one memory cell 7a is selected.

(b) Reset operation

When the level of the word line activation signal $PW_1$ changes from the VP level to the ground level, the word line activation signal having the ground level is sent to the word line $WL_{1-1}$ through the NMOS 53-1-1 and the PMOS 51-1-1 which have already been turned on.

When the level of the decode signal A-1 then changes from the VCC level to the ground level, the NMOS 42-1 and the NMOS 53-1-1 are brought into an off state. Further, the inverter 41-1 changes the level of the node N41-1 from the ground level to the VCC level. Thus, the NMOS 43-1 is turned on, so that the level of the node N43-1 is brought to the ground level so as to turn on the PMOS 45-1. As a result, the level of the node N45-1 changes from ground level to the VP level. Thus, the PMOS 51-1-1 is turned off and the NMOS 52-1-1 is turned on in response to the VP level of the node N45-1 so that the resetting of the word line $WL_{1-1}$ is completed.

(2) Read operation

The R/W controller 10 is brought into a data read operating state based on the control signal $S_1$. Set and reset operations for selecting a desired word line are performed in a manner similar to the write operation. The output data $D_o$ can be read out from the output buffer 12 based on an address selected by the bit line driver 8.

The word line driver of the present embodiment shows only one level shifter 40-1 which is selected based on the decode signal A-1. However, the word line driver includes level shifters 40-1 to 40-l and output circuits 50-1-1 to 50-l-m as shown in FIG. 4.

Figure 4:
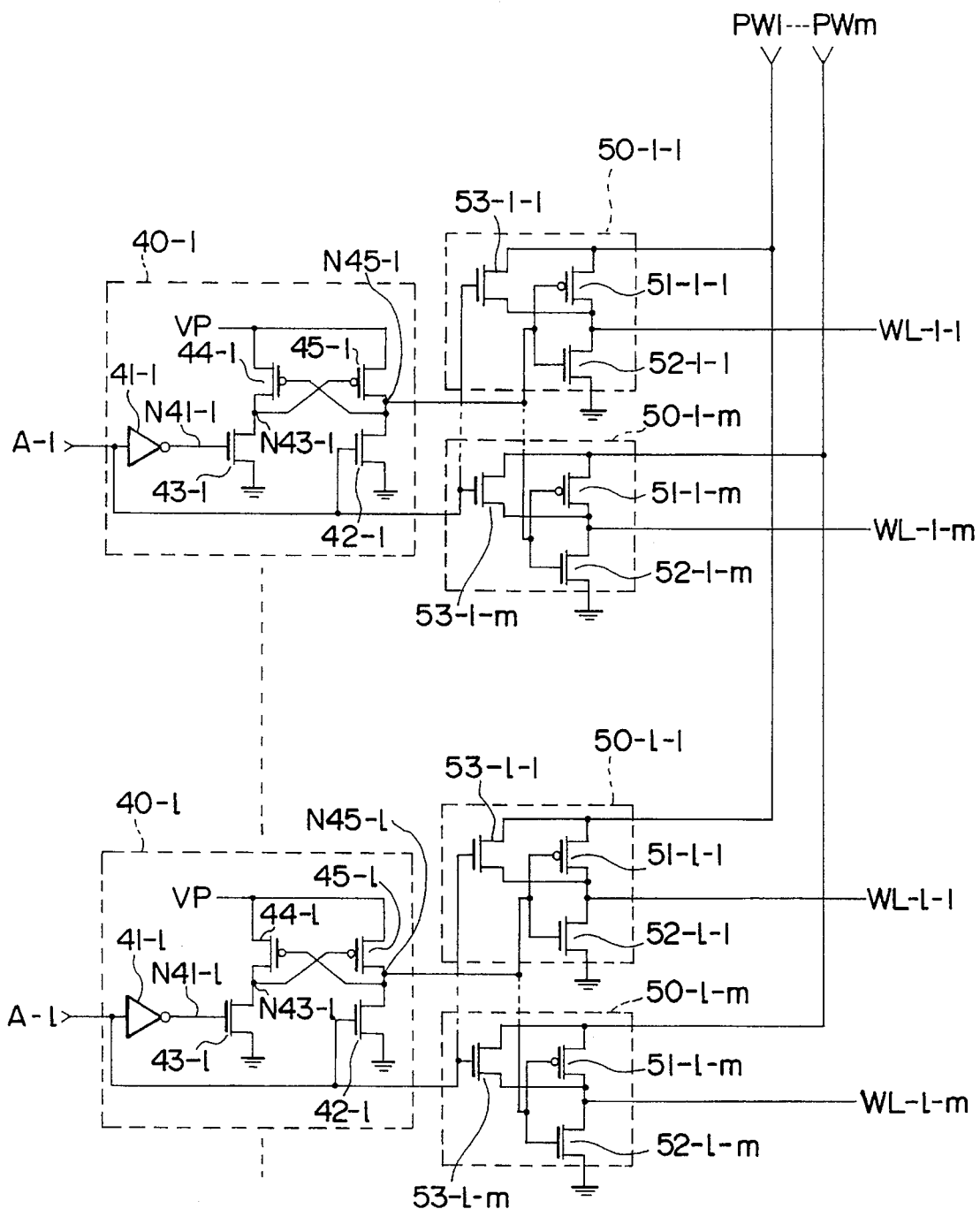
FIG. 4 is a circuit diagram of the entire word line driver shown in FIG. 1.

In FIG. 4, the word line activation signal $PW_1$ is input to output circuits 50-1-1 to 50-l-1. In the same manner, the word line activation signals $PW_2$ (not shown in FIG. 4) to $PW_m$ are input to output circuits 50-1-2 to 50-l-2 (not shown in FIG. 4) to 50-1-m to 50-l-m. In the present embodiment, only one of the word line activation signals $PW_1$ to $PW_l$ has the VP level, while the other word line activation signals have the ground level.

The word line driver shown in FIG. 4 has level shifters 40-1 to 40-l each of which receives one of the decode signals A-1 to A-l, respectively. The level shifters 40-1 to 40-l are coupled to the output circuits 50-1-1 to 50-l-1, 50-1-2 to 50-l-2, . . . , 50-1-m to 50-l-m, respectively. In the present embodiment, only one of the decode signals A-1 to A-l has the VCC level which is lower than the VP level, while the other decode signals have the ground level.

Now, the case will be explained that the word line activation signal $PW_1$ having the VP level is input to the output circuits 50-1-1 to 50-l-1 and the decode signal A-1 having the VCC level is input to the level shifter 40-1, i.e., the word line $WL_{1-1}$ is selected. At this time, a voltage level of the gate of the NMOS 53-1-1 of the selected output circuit 50-1-1 is the VCC level and a voltage level of the gate of the PMOS 51-1-1 of the selected output circuit 50-1-1 is the ground level since the selected level shifter 40-1 outputs the ground level signal to the node N45-1. Then, both of the NMOS 53-1-1 and PMOS 51-1-1 are in an on state. Therefore, the word line activation signal $PW_1$ having the VP level is supplied to the word line $WL_{1-1}$ through the NMOS 53-1-1 and PMOS 51-1-1.

At the same time, for example, a voltage level of the gate of the NMOS 53-1-1 of the non-selected output circuit 50-l-1 is the ground level and a voltage level of the gate of the PMOS 51-1-1 of the non-selected output circuit 50-l-1 is the VP level, since the decode signal A-l has the ground level and the non-selected level shifter 40-l outputs the VP level signal to the node N45-l. Then, both of the NMOS 53-1-1 and PMOS 51-1-1 are in the off state. Therefore, the word line activation signal $PW_1$ having the VP level is not supplied to the word line $WL_{1-l}$ through the NMOS 53-l-1 1-1 and PMOS 51-1-1.

If the word line driver does not have the level shifter 40-l as the prior word line driver does, the PMOS 51-1-1 of the non-selected output circuit 50-l-1 receives the VCC level since the inverted decode signal A-l has the VCC level. Then, the PMOS 51-1-1 is not completely in the off state since the VP level signal is applied to the source of the PMOS 51-1-1. Therefore, a part of the voltage level of the word line activation signal $PW_1$ leaks out to the non-selected word line $WL_{l-1}$ through the PMOS 51-1-1.

According to the present invention, as has been described the above, the NMOSs 53-1-1 through 53-l-m for receiving the decode signals A-1 through A-l as the gate input corresponding to the input of each level shifter, and the PMOSs 51-1-1 through 51-l-m whose each gate is controlled based on the voltage having the VP level, which corresponds to the output of the level shifter, are used as means for transmitting the word line activation signals to their corresponding word lines. Therefore, the word line activation signal can be reliably sent to a desired word line alone. Thus, the read and write operations can be stably performed. Further, since one level shifter serves so as to drive a plurality of output circuits, the number of elements can be reduced.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or any embodiments as fall within the true scope of the invention.

What is claimed is:

1. A word line driver, comprising:

a driver circuit for outputting a plurality of word line activation signals, at least one of which has a pumped voltage level;

a plurality of groups of first conductivity type transistors, each group having its first conductivity type transistors controlled based on a respective decode signal having first and second logic levels both of which are lower than the pumped voltage level, one of the groups of the first conductivity type transistors being activated in response to the decode signal so as to output the word line activation signals; and a plurality of groups of second conductivity type transistors, each group having its second conductivity type transistors controlled based on a drive signal having the pumped voltage level and a predetermined voltage level respectively opposite in phase to the decode signal, said second conductivity type transistors being respectively parallel-connected to said first conductivity type transistors, and one of said groups of second conductivity type transistors being activated so as to output the word line activation signals.

2. The word line driver as claimed in claim 1, further including a plurality of level shifters for outputting the drive signals, each level shifter comprising:

a switching circuit controlled based on the decode signal and activated so as to send the predetermined voltage level to said second conductivity type transistors in response to the decode signal having the second logic level, and a latch circuit receiving the decode signal and latching and outputting the drive signal having the pumped voltage level to said second conductivity type transistors in response to the decode signal having the first logic level.

3. A word line driver according to claim 1, wherein the first conductivity-type transistors are NMOS transistors and the second conductivity-type transistors are PMOS transistors.

4. A word line driver, comprising:

a driver circuit for generating a pumped voltage;

a level shifter for outputting a level shifted signal in response to a decode signal;

an output circuit including a first transistor of a first conductivity-type and a second transistor of a second conductivity-type, the second transistor being parallel connected to the first transistor, one of the first and second transistors being controlled based on the level shifted signal and the other of the first and second transistors being controlled based on the decode signal so as to together provide a path for coupling the driver circuit to a word line.

5. A word line driver according to claim 4, wherein the first conductivity-type transistor is an NMOS transistor and the second conductivity-type transistor is a PMOS transistor.

6. A word line driver as claimed in claim 4, wherein the level shifted signal is opposite in phase to the decode signal.

7. A word line driver as claimed in claim 6, further comprising a third transistor controlled based on the level shifted signal and connected between the word line and a ground voltage.

8. A word line driver, comprising:

a driver circuit for outputting a plurality of word line activation signals, at least one of which has a pumped voltage level;

a plurality of groups of output circuits, each output circuit having a first conductivity-type transistor and a second conductivity-type transistor parallel-connected to the first conductivity-type transistor, wherein the first conductivity-type transistors of each group are controlled based on a respective decode signal corresponding to the group, the decode signal having first and second logic levels both of which are lower than the pumped voltage level, the first conductivity-type transistors of one of the groups being activated in response to the decode signal so as to pass the word line activation signals output by the driver circuit to corresponding word lines, and wherein the second conductivity-type transistors of each group are controlled based on a corresponding drive signal having first and second voltage levels which are opposite in phase to the decode signal that corresponds to the group, one of the first and second voltage levels being higher than the first and second logic levels, and the second conductivity-type transistors of one of the groups being activated so as to pass the word line activation signals output by the driver circuit to corresponding word lines.

9. A word line driver according to claim 8, wherein the first conductivity-type transistors are NMOS transistors and the second conductivity-type transistors are PMOS transistors.

10. A word line driver as claimed in claim 8, further including for each group a respective level shifter for outputting the drive signal to the second conductivity-type transistors of the group, each level shifter comprising:

a switching circuit controlled based on the decode signal corresponding to the group, the switching circuit being activated so as to send the second voltage level to the second conductivity-type transistors of the group when the corresponding decode signal has the second logic level, and a latch circuit receiving the decode signal and latching and outputting the drive signal to the second conductivity-type transistors in response to the decode signal having the first logic level, when the drive signal has the first voltage level.

11. A word line driver, comprising:

a driver circuit for outputting a plurality of word line activation signals, at least one of which has a pumped voltage level;

a level shifter for outputting a level shifted signal in response to a decode signal; and a plurality of output circuits each including a first conductivity-type transistor forming, in response to the decode signal, a signal path for sending one of the word line activation signals to a corresponding word line, and a second conductivity-type transistor forming, in response to the level shifted signal, a signal path for sending said one of the word line activation signals to said word line.

12. A word line driver according to claim 11, wherein each first conductivity-type transistor is a NMOS transistor and each second conductivity-type transistor is a PMOS transistor.

13. A word line driver as claimed in claim 11, wherein the drive signal and the decode signal are opposite to each other in phase.

* * * * *